US009442329B2

(12) United States Patent
Yang (10) Patent No.: US 9,442,329 B2
(45) Date of Patent: Sep. 13, 2016

(54) LIQUID CRYSTAL DISPLAY

(71) Applicant: Innolux Corporation, Miao-Li County (TW)

(72) Inventor: Ching-Che Yang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/820,621

(22) Filed: Aug. 7, 2015

(65) Prior Publication Data

US 2016/0062192 A1    Mar. 3, 2016

(30) Foreign Application Priority Data

Sep. 1, 2014    (TW) .............................. 103130087 A (51) Int. Cl.
| | |
|---|---|
| *H01L 29/12* | (2006.01) |
| *G02F 1/1343* | (2006.01) |
| *H01L 27/12* | (2006.01) |
| *G02F 1/1362* | (2006.01) |

(52) U.S. Cl.
CPC ... *G02F 1/134309* (2013.01); *G02F 1/136227* (2013.01); *G02F 1/136286* (2013.01); *H01L 27/124* (2013.01); *H01L 27/1255* (2013.01); *G02F 2001/134345* (2013.01)

(58) Field of Classification Search
CPC ......................... H01L 27/124; H01L 27/1255
USPC .......................................................... 257/71
See application file for complete search history.

(56) References Cited

U.S. PATENT DOCUMENTS

2010/0134707 A1* 6/2010 Kim .................. G02F 1/133707
                                                          349/37
2015/0062516 A1    3/2015 Jung et al.

FOREIGN PATENT DOCUMENTS

| CN | 101546073 A | 9/2009 |
| CN | 102768445 A | 11/2012 |

OTHER PUBLICATIONS

TW Office Action dated Jul. 27, 2015 in corresponding Taiwan application (No. 103130087).

* cited by examiner

*Primary Examiner* — Douglas Menz
(74) *Attorney, Agent, or Firm* — McClure, Qualey & Rodack, LLP (57) ABSTRACT

An LCD comprises a first scan line, a second scan line, a first data line, a second data line, a pixel area, a first sub-pixel electrode and a first active element. The first scan line has a first sidewall; the second scan line has a second sidewall adjacent to the first sidewall; and the first data line has a third sidewall intersecting with the first sidewall and the second sidewall. The second data line has a fourth sidewall adjacent to the third sidewall. The pixel area is an area defined by the first sidewall, the second sidewall, the third sidewall and the fourth sidewall. The first sub-pixel is partially disposed in the pixel area. The first active element has a first electrode electrically connected to the first sub-pixel electrode through a first via hole, wherein a portion of the first via hole is disposed out of the pixel area.

11 Claims, 7 Drawing Sheets

LIQUID CRYSTAL DISPLAY

This application claims the benefit of Taiwan application Serial No. 103130087, filed Sep. 1, 2014, the subject matter of which is incorporated herein by reference.

BACKGROUND

1. Technical Field

The disclosure in generally relates to a display device and more particularly to a liquid crystal display (LCD).

2. Description of the Related Art

Currently, the design of LCDs is trending towards to offer high luminance, high contrast ratio and wide viewing angle. Several technologies for improving the viewing angle of an LCD have been provided to satisfy the design requirements. A multi-domain vertical alignment liquid crystal display (MVA LCD) is a common type of LCD with wide viewing angle.

Figure 1:
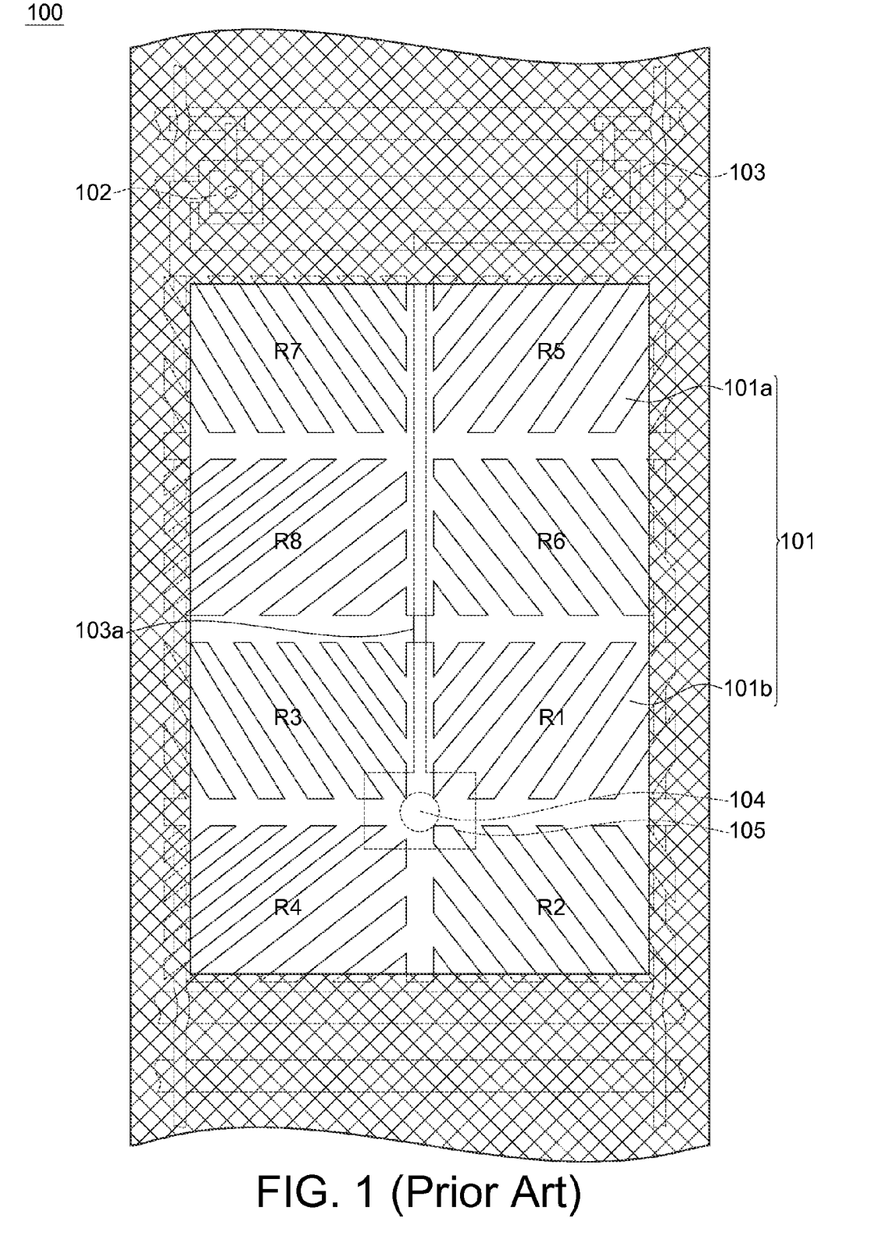
FIG. 1 is a top view illustrating a partial pixel structure of a conventional MVA LCD.

A MVA LCD typically has a plurality of alignment protrusions or slits disposed above a substrate with thin film transistor (TFT) array formed thereon, and used to direct the liquid crystal molecule tilting in various directions, whereby a plurality of alignment domains, e.g. alignment domains R1, R2, R3, R4, R5, R6, R7 and R8 as shown in FIG. 1, are obtained. When different voltages are applied, the liquid crystal molecule may be tilted in various angles to make images that are observed by a user from different view angles has identical phase difference. Such that an LCD with wide viewing angle can be implemented.

However, the transmittance of the MVA LCD may vary at different view angles. As a result, color shift may occur and chroma (saturation) of the MVA LCD may be deteriorated.

In order to solve these problems, the pixel electrode 101 of a conventional MVA LCD 100 is divided into at least two independent sub-pixel electrodes, such as two independent sub-pixels electrode 101a and 101b (as shown in FIG. 1), respectively controlled by different active elements 102 and 103 are provided. By applying two different voltages to these two independent sub-pixels 101a and 101b respectively to make the LCD molecules overlying thereof tilting in different angles and form a plurality of alignment domains, the problems of color shift and chroma deterioration can be significantly improved.

But this approach still has some drawbacks. In the conventional MVA LCD 100, the electrode 103a of the active element 103 typically extends across the sub-pixel electrode 101a and electrically connects to the sub-pixel electrode 101b through a via hole 104 formed at the center of the sub-pixel electrode 101b. In order to prevent light leaking from the via hole 104, a patterned metal layer 105 with a size substantially larger than that of the via hole 104 is generally formed on the position where the via hole 104 connected to the sub-pixel electrode 101b. Such that, the aperture ratio of the pixel electrode 101 can be decreased due to the shielding of the patterned metal layer 105.

Therefore, there is a need of providing an improved LCD to obviate the drawbacks encountered from the prior art.

SUMMARY

One aspect of the present embodiment is to provide an LCD, wherein the LCD comprises a first scan line, a second scan line, a first data line, a second data line, a pixel area, a first sub-pixel electrode and a first active element. The first scan line has a first sidewall; the second scan line has a second sidewall adjacent to the first sidewall; and the first data line has a third sidewall intersecting with the first sidewall and the second sidewall. The second data line has a fourth sidewall adjacent to the third sidewall. The pixel area is defined by the first sidewall, the second sidewall, the third sidewall and the fourth sidewall. The first sub-pixel electrode is disposed in the pixel area. The first active element has a first electrode electrically connected to the first sub-pixel electrode through a first via hole, wherein at least a portion of the first via hole is disposed out of the pixel area.

In accordance with the aforementioned embodiments, a LCD with a plurality of sub-pixel electrodes formed in a pixel area is provided to improve the problems of color shift and chroma deterioration. In some embodiments, at least a portion of a via hole that is used to electrically connect an active element with one of the sub-pixel electrodes is disposed out of the pixel area in order to increase the aperture ratio of the pixel area, and to prevent light leaking form the via hole.

BRIEF DESCRIPTION OF THE DRAWINGS

The above objects and advantages of the embodiments of present invention will become more readily apparent to those ordinarily skilled in the art after reviewing the following detailed description and accompanying drawings, in which.

DETAILED DESCRIPTION

The embodiments as illustrated below provide an LCD to solve the problems of color shift and chroma deterioration as well as to increase the aperture ratio of the pixel area of the LCD. The present invention will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

Figure 2:
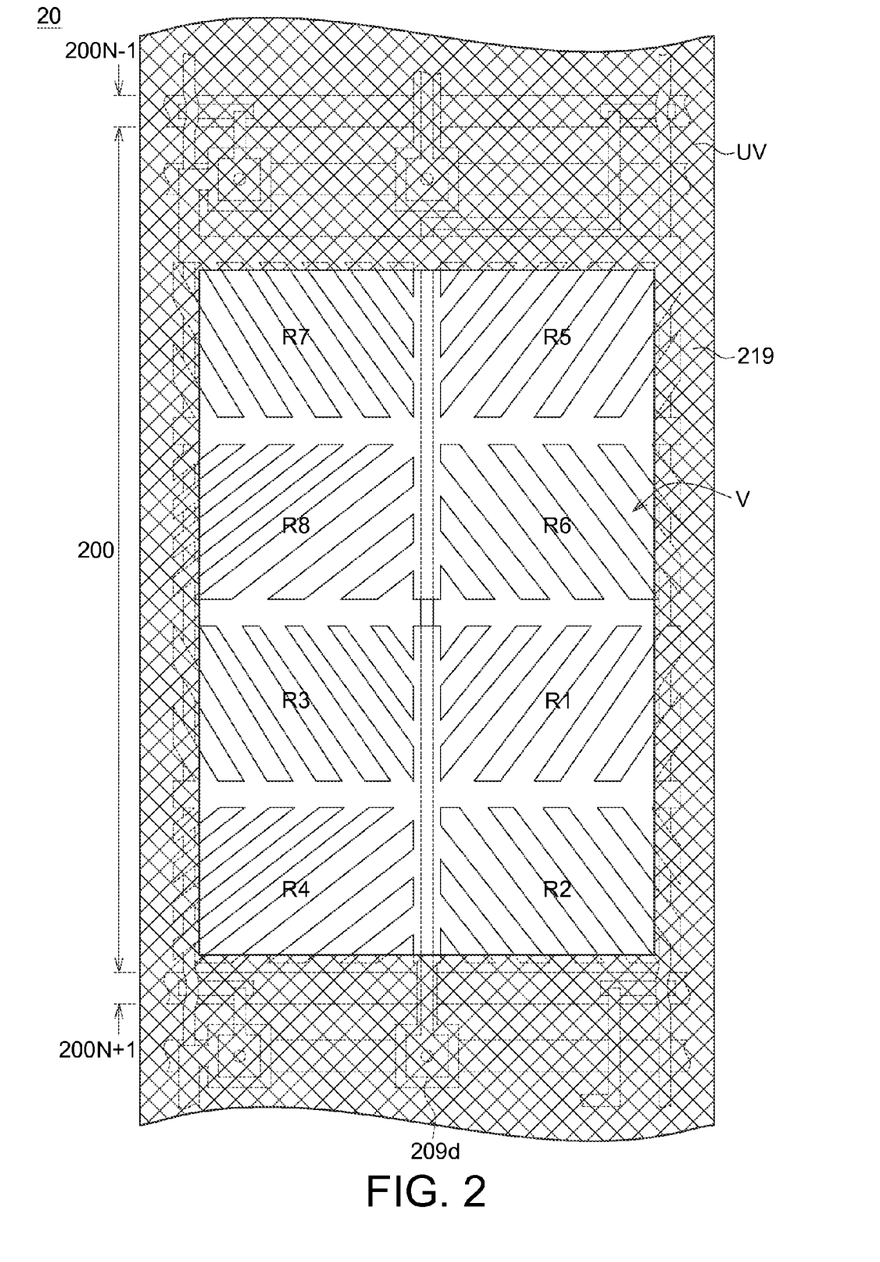
FIG. 2 is a top view illustrating a partial pixel structure of a MVA LCD in accordance with one embodiment of the present invention.

FIG. 2 is a top view illustrating a partial pixel structure 20 of a MVA LCD in accordance with one embodiment of the present invention. The pixel structure 20 comprises a plurality of pixel areas (such as the pixel areas 200N, 200N+1 and 200N−1 as shown in FIG. 2) formed on a substrate 201 (not shown in the FIG. 2). For purpose of providing a clear description, a series processing structures for fabricating the pixel structure 20 are provided.

Figure 2A:
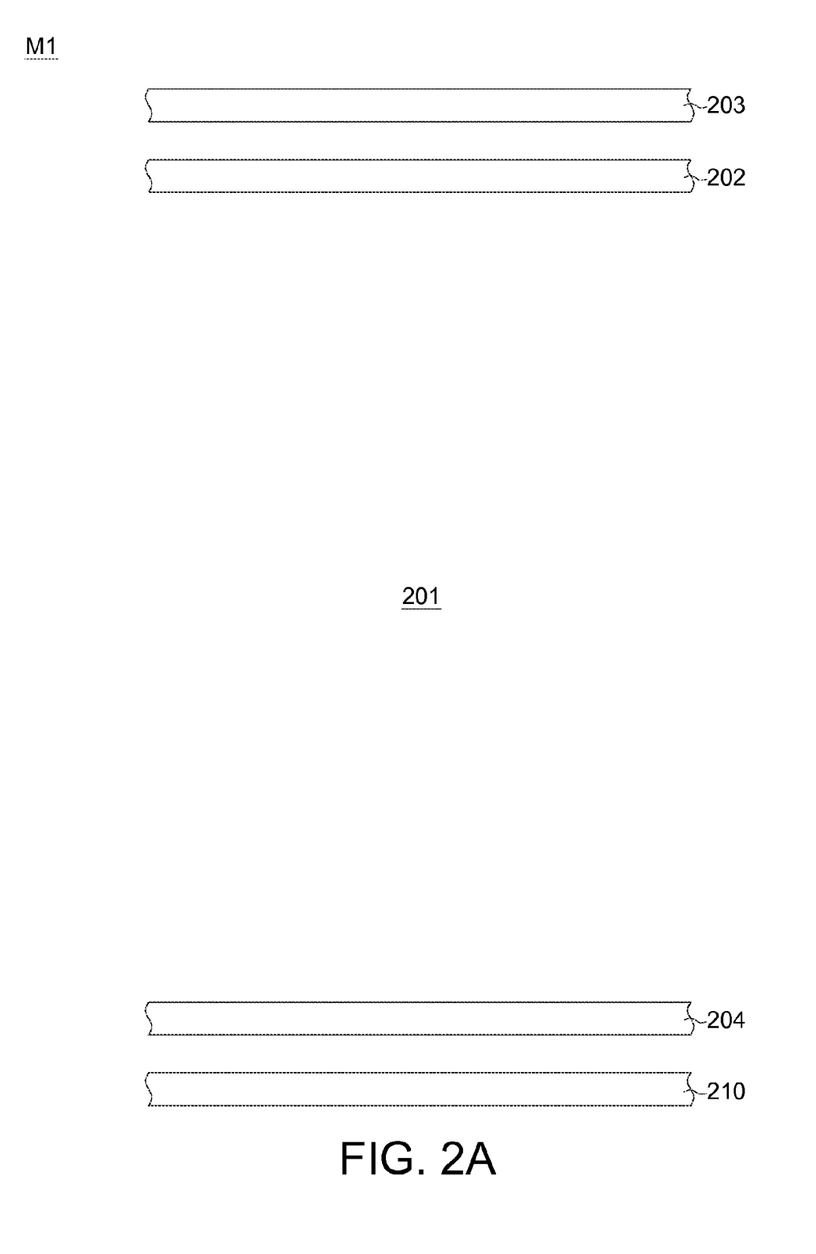
FIGS. 2A to 2C are top views illustrating a series of processing structures for fabricating the pixel structure depicted in FIG. 2.
Figure 2B:
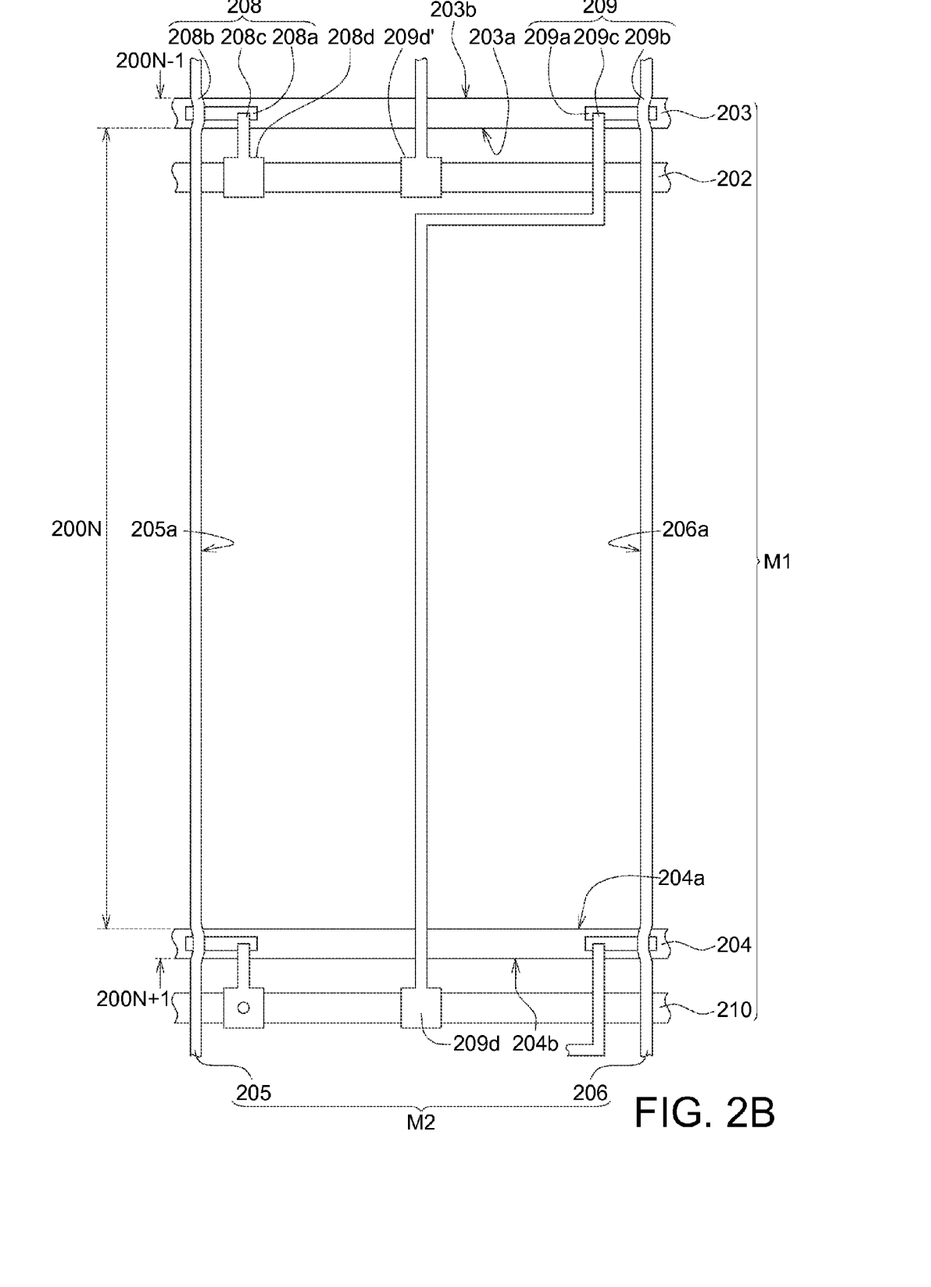
Figure 2C:
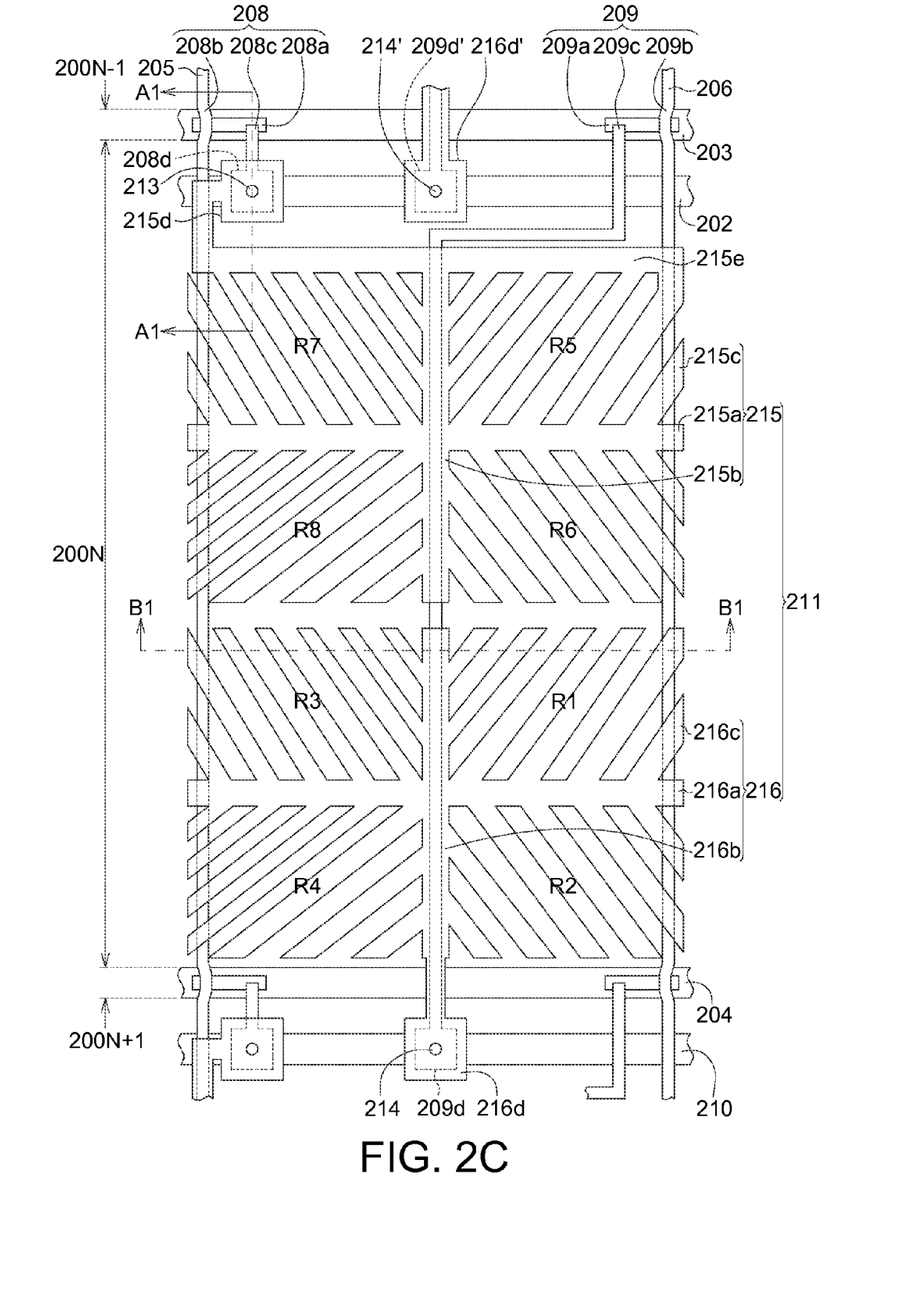

FIGS. 2A to 2C are top views illustrating a series of processing structures for fabricating the pixel structure 20 depicted in FIG. 2. The process for fabricating the pixel structure 20 comprises steps as follows: Firstly, a patterned metal layer M1 is formed on the substrate 201 by a photolithography process, wherein the patterned metal layer M1 comprises a plurality of scan lines, such as a first scan line 203 and a second scan line 204, and a plurality of active elements, such as active elements 208 and 209, the active elements 208 or 209 subsequently formed on the substrate 201. In some embodiments of the present invention, two adjacent scan lines, such as the first scan line 203 and the second scan line 204, are parallel to each other. In the present embodiment, the patterned metal layer M1 further comprises a plurality of storage capacitor electrodes 202 and 210, wherein each of these storage capacitor electrodes 202 and 210 is disposed between two adjacent scan lines, e.g. the storage capacitor electrode 202 is disposed between the first scan line 203 and the second scan lines 204 (see FIG. 2A). Of note that the storage capacitor electrodes 202 and 210 are not critical and can be optionally formed under the necessity of the pixel structure design.

Next, an insulation layer (not shown), a semiconductor layer (not shown) and a second metal layer M2 are formed in sequence, and another photolithography process is then performed to pattern the second metal layer M2, Wherein the patterned second metal layer M2 comprises a plurality of data lines, such as a first data line 206 and a second data line 205, intersecting with the first scan line 203 and the second scan line 204. In the embodiments of the present invention, a pixel area is defined by two adjacent sidewalls of two adjacent scan lines and two adjacent sidewalls of two adjacent data lines.

For example, in the present embodiment (see FIG. 2B), the pixel area 200N is defined by the two adjacent sidewalls of the first scan line 203 and the second scan line 204 (referred as the first sidewall 203a and the second sidewall 204a respectively), and the two adjacent sidewalls of the first data line 206 and the second data line 205 (referred as the third sidewall 206a and the fourth sidewall 205a respectively). The first sidewall 203a of the first scan line 203 and the second sidewall 204a of the second scan line 204 respectively intersect with the third sidewall 206a of the first data line 206 and the fourth sidewall 205a of the second data line 205. In other words, the pixel area 200N is defined by the first sidewall 203a, the second sidewall 204a, the third sidewall 206a and the fourth sidewall 205a.

Yet another example, the pixel area 200N−1 is defined by the first sidewall 203b of the first scan line 203, a sidewall of another scan line (not shown) adjacent to the first sidewall 203b, the third sidewall 206a of the first data line 206 and the fourth sidewall 205a of the second data line 205. the pixel area 200N+1 is defined by the second sidewall 204b of the second scan line 204, a sidewall of another scan line (not shown) adjacent to the second sidewall 204b, the third sidewall 206a of the first data line 206 and the fourth sidewall 205a of the second data line 205.

It should be appreciated that, the sidewalls of each scan lines, such as the first sidewall 203a and the second sidewall 204a, as well as the sidewalls of each data lines, such as the third sidewall 206a and the fourth sidewall 205a, are not limited to be straight-line shape. In some embodiments of the present invention, the sidewalls of each scan lines and the sidewalls of each data lines may comprise a curve segment or a zigzag segment; and the sidewalls of two adjacent scan lines and the sidewalls of two data line are not limited being parallel to each other. In other words, the shape of the pixel areas 200N, 200N−1 and 200N+1 may varied dependent upon the different designs of the pixel structure 20. In addition, the number of the pixel areas included in the pixel structure 20 are not limited, nevertheless there are mere three pixel areas 200N, 200N−1 and 200N+1 depicted in FIG. 2B. For purpose of providing a clear description, the detailed process performed on the pixel area 200N may be taken as an example to illustrate the process for fabricating the pixel structure 20. Subsequently, a thin film stacking process is performed on the pixel area 200N to form a plurality of active elements, such as the first active element 209 and the second active element 208 (see FIG. 2B). In some embodiments of the present invention, the first active element 209 is disposed above the first scan line 203 and comprises a gate electrode 209a, a first electrode 209c and a second electrode 209b. The first electrode 209c may be a drain electrode, and the second electrode 209b may be a source electrode. Alternatively, the first electrode 209c may be a source electrode, and the second electrode 209b may be a drain electrode. In the embodiments of the present invention, the positions of the source electrode and drain electrode of each active element are not limited. Any persons skilled in the art can arrange the positions thereof in accordance with a physical wiring design of the pixel structure 20. The gate electrode 209a is electrically connected to the first scan line 203; the first electrode 209c has a first electrode extending portion 209d electrically connected to a first sub-pixel electrode 216 subsequent formed in the pixel area 200N through a first via hole 214; and the second electrode 209b is electrically connected to the first data line 206.

The second active element 208 comprises a gate electrode 208a, a third electrode 208c and a fourth electrode 208b. The third electrode 208c may be a drain electrode, and the fourth electrode 208b may be a source electrode. Alternatively, the third electrode 208c may be a source electrode, and the fourth electrode 208b may be a drain electrode. In the embodiments of the present invention, the positions of the source electrode and drain electrode of each active element are not limited. The gate electrode 208a is electrically connected to the first scan line 203; the third electrode 208c has a third electrode extending portion 208d electrically connected to a second sub-pixel electrode 215 through a second via hole 213; and the fourth electrode 208b is electrically connected to the second data line 205.

In some embodiments of the present invention, the third electrode extending portion 208d merely extends above and overlaps with partial of the storage capacitor electrodes 202. The first electrode extending portion 209d extends outwards and beyond the pixel area 200N, and at least a portion of the first electrode extending portion 209d overlaps with a portion of the second scan line 204. In the present embodiment, the first electrode extending portion 209d extends, along a direction departing from the first scan line 203 into the pixel area 200N$_+$1, across the second scan line 204 and overlaps a portion of the storage capacitor electrode 210 that is disposed in the pixel area 200N$_+$1. Similarly, the pixel area 200N−1 also has a first electrode extending portion 209d' extending, along a direction parallel to the first data line 206 and the second data line 205, from the pixel area 200N−1 into the pixel area 200N, and overlaps with a portion of the storage capacitor electrode 202 that is disposed in the pixel area 200N (see FIG. 2B).

Figure 3A:
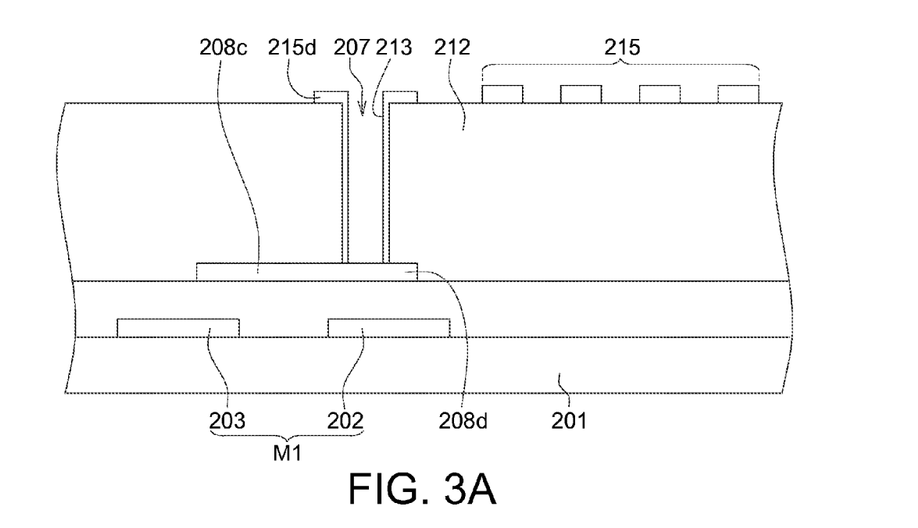
FIG. 3A is a cross-sectional view illustrating a portion of the pixel structure depicted in FIG. 2C taken along the line A1-A1.
Figure 3B:
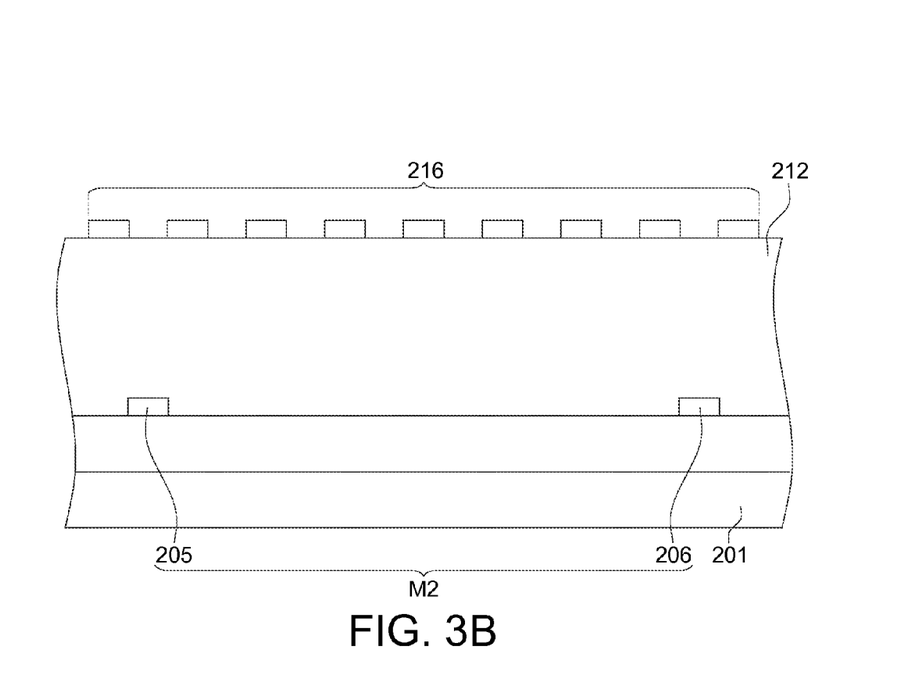
FIG. 3B is a cross-sectional view illustrating a portion of the pixel structure depicted in FIG. 2C taken along the line B1-B1.

Referring to FIG. 2C and FIGS. 3A to 3B, an insulation layer 212 is formed on the patterned second metal layer M2, and a plurality of via holes 207 are then formed in the insulation layer 212 to expose portions of the first electrode extending portion 209d and portions of the third electrode extending portion 208d. A patterned pixel electrode 211 is next formed on the insulation layer 212 and at least covers the inner sidewall of the via holes 207, so as to form a first via hole 214 and a second via hole 213 passing through the insulation layer 212. As a result, the patterned pixel electrode 211 can be electrically connected to the first electrode extending portion 209d and the third electrode extending portion 208d respectively by the first via hole 214 and the second via hole 213.

FIG. 3A is a cross-sectional view illustrating a portion of the pixel structure depicted in FIG. 2C taken along the line A1-A1. FIG. 3B is a cross-sectional view illustrating a portion of the pixel structure depicted in FIG. 2C taken along the line B1-B1. Wherein the insulation layer 212 can be made of either organic dielectric or non-organic dielectric material. For example, in some embodiments of the present invention, the insulation layer 212 may be made of material for forming a color filter or polymer material. The insulation layer 212 has a thickness substantially ranging from 1 μm to 5 μm. In the embodiments of the present invention, the insulation layer 212 has an enough thickness to allow portions of the patterned pixel electrode 211 subsequently formed thereon extends outwards and overlaps partial of the first data line 206 and the second data line 205 without occurring any crosstalk. In the present embodiment, the insulation layer 212 has a thickness substantially of 3 μm.

Referring to FIG. 2C again, the patterned pixel electrode 211 can be divided into a first sub-pixel electrode 216 and a second sub-pixel electrode 215. Each of the first sub-pixel electrode 216 and the second sub-pixel electrode 215 may comprises a main electrode portion, such as the first main electrode portion 216b or the second main electrode portion 215b, and a branch electrode portion, such as the first branch electrode portion 216a or the second branch electrode portion 215a. The first main electrode portion 216b connected to the first branch electrode portion 216a, the first main electrode portion 216b and the first branch electrode portion 216a of the first sub-pixel electrode 216 can divide the first sub-pixel electrode 216 into four alignment domains R1, R2, R3 and R4; the second main electrode portion 215b connected to the second branch electrode portion 215a, the second main electrode portion 215b and the second branch electrode portion 215a of the second sub-pixel electrode 215 can divide the second sub-pixel electrode 215 into four alignment domains R5, R6, R7 and R8. In each of the alignment domains R1, R2, R3, R4, R5, R6, R7 and R8, there are a plurality of sub-branch electrode portions, such as the sub-branch electrode portions 215c or 216c, extending outwards from the first main electrode portion 216b, the first branch electrode portion 216a, the second main electrode portion 215b or the second branch electrode portion 215a.

When image is displayed by the pixel structure 20, the liquid crystal molecules (not shown) may be tilted in at least four directions with different magnitudes, such that wide viewing angle can be implemented at the pixel structure 20. However, it should be appreciated that the number of the alignment domains included in a pixel structure 20 is not limited, nevertheless there are mere four alignment domains formed in the first sub-pixel electrode 216 and the second sub-pixel electrode 215 respectively as shown in the FIG. 2C. Any persons skilled in the art can chose the number, type and shape of the main electrode portion, the branch electrode portion and the sub-branch electrode portion for each sub-pixel electrode in accordance with a physical wiring design of the pixel structure 20.

In some embodiments of the present invention, the first sub-pixel electrode 216 and the second sub-pixel electrode 215 respectively have a first sub-pixel electrode extending portion 216d and a second sub-pixel electrode extending portion 215d. The second sub-pixel electrode extending portion 215d extends outwards from the outer frame 215e of the second sub-pixel electrode 215 to the position above the third electrode extending portion 208d and electrically connected to the second via hole 213. The first sub-pixel electrode extending portion 216d extends outwards from the first main electrode portion 216b, along the direction departing from the first scan line 203, crossing the second scan line 204, to the position above the first electrode extending portion 209d and electrically connected to the first via hole 214.

In addition, the portions of the first electrode extending portion 209d extending beyond the pixel area 200N may respectively overlap a portion of the first sub-pixel electrode 216 and a portion of the second sub-pixel electrode 215. For example, in the present embodiment, the first electrode extending portion 209d extends from the first electrode 209c, along the direction substantially parallel to the first data line 206 and the second data line 205, crossing the second scan line 204, towards the pixel area 200N+1 (i.e. along the direction departing from the first scan line 203), and overlaps with the second main electrode portion 215b of the second sub-pixel electrode 215, the first main electrode portion 216b of the first sub-pixel electrode 216 and the first sub-pixel electrode extending portion 216d (see FIG. 2C).

Since the first main electrode portion 216b of the first sub-pixel electrode 216 and the first electrode extending portion 209d of the first active element 209 used to control the first sub-pixel electrode 216 both extend across the second scan line 204 and beyond the pixel area 200N, thus at least a portion of the first via hole 214 that is used to connect the first electrode extending portion 209d with the first sub-pixel electrode extending portion 216d may be disposed out of the pixel area 200N. In other words, at least partial of the first via hole 214 may be disposed outside of the pixel area 200N departing from the second sidewall 204a of the second scan line 204.

In some embodiments of the present invention, all of the first via hole 214 is disposed outside of the pixel area 200N. Alternatively, in some other embodiments of the present invention, partial of the first via hole 214 is disposed out of the pixel area 200N or at least partial of the first via hole 214 overlaps with partial of the scan line 204.

For example, in the present embodiment, the first sub-pixel electrode extending portion 216d of the first sub-pixel electrode 216 and the first electrode extending portion 209d of the first active element 209 both extend outwards the pixel area 200N, across the second scan line 204, and into the pixel area 200N+1, whereby the first via hole 214 that is used to connect the first electrode extending portion 209d with the first sub-pixel electrode extending portion 216d is formed in the pixel are 200N+1, and at least partially overlaps with at least partial of the storage capacitor electrode 210 disposed in the pixel are 200N+1. Similarly, the first sub-pixel electrode extending portion 216d' and the first electrode extending portion 209d' both extend from the pixel area 200N−1, across the first scan line 203, and into the pixel area 200N, whereby the first via hole 214' that is used to connect the first electrode extending portion 209d' with the first sub-pixel electrode extending portion 216d' is formed in the pixel are 200N, and at least partially overlaps with at least partial of the storage capacitor electrode 202 disposed in the pixel are 200N.

Thereafter, a black matrix 219 is formed at the periphery of the patterned pixel electrode 211 in a manner of covering the first data line 206, the second data line 205, the first scan line 203, the second scan line 204, the storage capacitor electrodes 202 and 210 as well as a portion of the patterned pixel electrode 211, so as to define a visible region V and an invisible region UV in the pixel area 200N (see FIG. 2). Since the first via hole 214 (214') of the pixel area 200N (200N−1) that is used to connect the first electrode extending portion 209 (209d') with the first sub-pixel electrode extending portion 216 (216d') is formed in the invisible region UV of the pixel area 200N+1 (200N) and covered by the black matrix 219, thus the arrangement of the first via 214 hole (214') may not affect the aperture ratio of the pixel area 200N+1 (200N), and an additional patterned metal layer has no need to prevent light leaking from the first via hole 214 (214').

Figure 4:
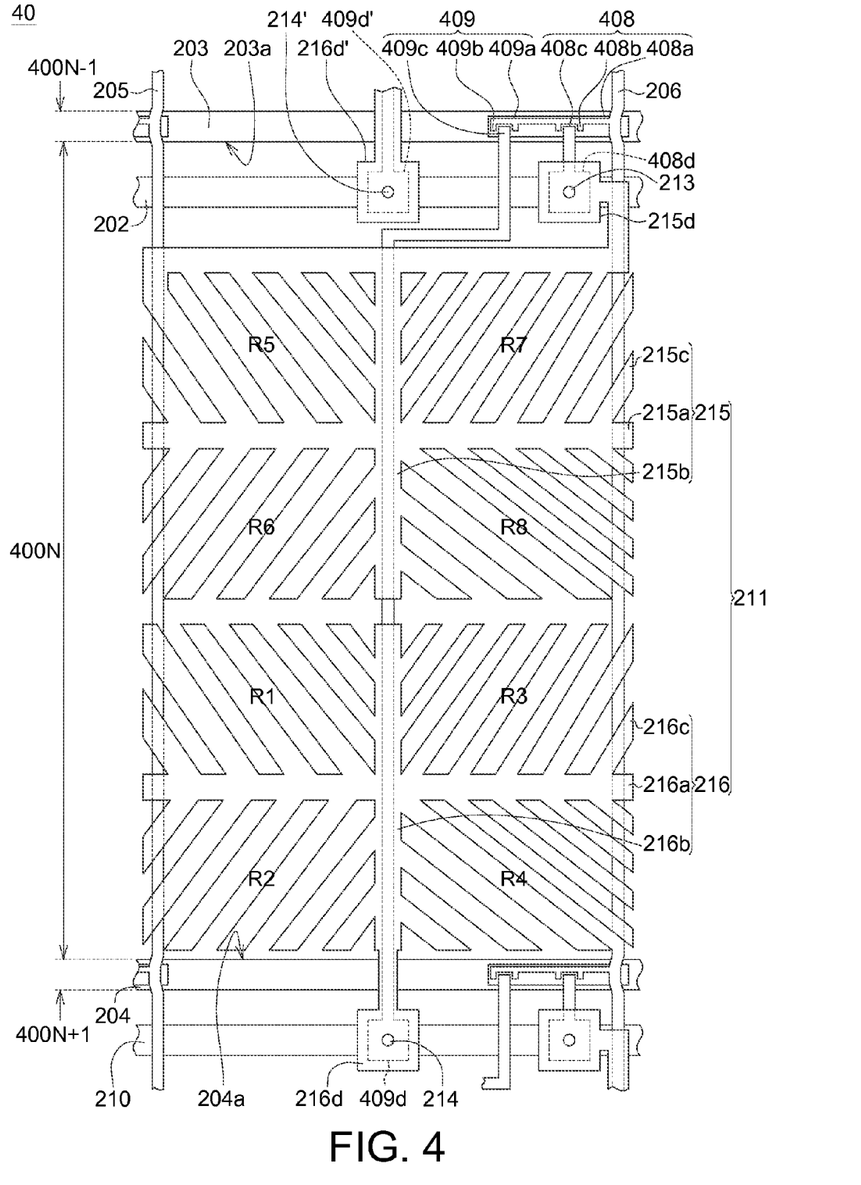
FIG. 4 is a top view illustrating a partial pixel structure of a MVA LCD in accordance with another embodiment of the present invention.

FIG. 4 is a top view illustrating a partial pixel structure 40 of an LCD in accordance with another embodiment of the present invention. The structure of the pixel structure 40 is similar to that of the pixel structure 20 depicted in FIG. 2 except that the second active element 408 used to control the patterned pixel electrode 211 is different from the first active element 209 and the second active element 208 of the pixel structure 20.

In the pixel structure 20 of the FIG. 2, the first active element 209 and the second active element 208 respectively used to control the first sub-pixel electrode extending portion 216 and the second sub-pixel electrode 215 of the patterned pixel electrode 211 are electrically connected to the first data line 206 and the second data line 205 respectively. In the present embodiment, the second electrode 209b of the first active element 209 and the fourth electrode 208b of the second active element 208 are electrically connected to the first data line 206 and the second data line 205 respectively. In other words, the first sub-pixel electrode extending portion 216 is controlled by the first scan line 203 and the first data line 206; and the second sub-pixel electrode 215 is controlled by the first scan line 203 and the second data line 205.

In the pixel structure 40 of the FIG. 4, the first active element 409 and the second active element 408 that are respectively used to control the first sub-pixel electrode 216 and the second sub-pixel electrode 215 of the patterned pixel electrode 211 are merely electrically connected to the first data line 206. Specifically, the first active element 409 comprises a gate electrode 409a electrically connected to the first scan line 203, a first electrode 409c electrically connected to the first sub-pixel electrode 216, and a second electrode 409b electrically connected to the first data line 206. The second active element 408 comprises a gate electrode 408a electrically connected to the first scan line 203, a third electrode 408c electrically connected to the second sub-pixel electrode 215, and a fourth electrode 408b electrically connected to the first data line 206. The gate electrode 408a of the second active element 408 and the gate electrode 409a of the first active element 409 are electrically connected to each other to form a common gate electrically connected to the first scan line 203. The second electrode 409b of the first active element 409 and the fourth electrode 408b of the second active element 408 are also electrically connected to each other to form a common electrode electrically connected to the first data line 206. In other words, both of the first active element 409 and the second active element 408, in the present embodiment, are controlled by the first scan line 203 and the first data line 206.

In the present embodiment, the third electrode 408c of the second active element 408 has a third electrode extending portion 408d electrically connected to the second sub-pixel electrode 215 of the pixel area 400N. The fourth electrode 408b is electrically connected to the first data line 206. The first electrode 409c has a first electrode extending portion 409d, and at least a portion of the first electrode extending portion 409d extends beyond the pixel area 400N and into the pixel area 400N+1, wherein the first electrode extending portion 409d is electrically connected to the first sub-pixel electrode extending portion 216d of the first sub-pixel electrode 216 through the first via hole 214. Similarly, the pixel area 400N−1 has a first electrode extending portion 409d' at least a portion of which extends into the pixel area 400N, and the first electrode extending portion 409d' is electrically connected to the first sub-pixel electrode extending portion 216d' of the sub-pixel electrode (not shown) formed in the pixel area 400N−1 through the first via hole 214'. Since the elements for constituting the pixel structure 40 are similar to that for constituting the aforementioned pixel structures, thus the detailed structure of the pixel structure 40 and the method for forming the same will not redundantly described therein.

In accordance with the aforementioned embodiments of the present invention, an LCD with a plurality sub-pixel electrodes formed in a pixel area is provided to improve the problems of color shift and chroma deterioration. In some embodiments, at least a portion of a via hole that is used to electrically connect an active element with one of the sub-pixel electrodes is disposed out of the pixel area in order to increase the aperture ratio of the pixel area, and to prevent light leaking form the via hole, wherein the active element is used to control the sub-pixel electrode.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A liquid crystal display (LCD), comprising:
a first scan line, having a first sidewall;
a second scan line, having a second sidewall adjacent to the first sidewall;
a first data line, having a third sidewall intersecting with the first sidewall and the second sidewall;
a second data line, having a fourth sidewall adjacent to the third sidewall;
a pixel area defined by the first sidewall, the second sidewall, the third sidewall and the fourth sidewall;
a first sub-pixel electrode, partially disposed in the pixel area; and
a first active element, having a first electrode electrically connected to the first sub-pixel electrode through a first via hole, wherein at least a portion of the first via hole is disposed out of the pixel area.

2. The LCD according to claim 1, wherein the first sub-pixel electrode comprises a first main electrode portion and a first branch electrode portion connected to the first main electrode portion; and the first electrode comprises a first electrode extending portion overlapping with the first main electrode portion.

3. The LCD according to claim 1, wherein the first sub-pixel electrode comprises a first sub-pixel electrode extending portion in contact with the first electrode through the first via hole; and at least a portion of the first sub-pixel electrode extending portion overlaps with the second scan line.

4. The LCD according to claim 2, wherein the first electrode extending portion extends along a direction departing from the first scan line and intersects with the second scan line.

5. The LCD according to claim 2, wherein the first sub-pixel electrode comprises a first sub-pixel electrode extending portion overlapping with the first electrode extending portion.

6. The LCD according to claim 1, wherein the first active element is disposed above the first scan line, and at least a portion of the first via hole overlaps with the second scan line.

7. The LCD according to claim 1, wherein a portion of the first sub-pixel electrode overlaps with the first data line and the second data line.

8. The LCD according to claim 1, further comprising:
a second active element disposed above the first scan line; and
a second sub-pixel electrode, disposed in the pixel area and electrically connected to the second active element through a second via hole.

9. The LCD according to claim 1, wherein the first active element further comprises a second electrode electrically connected to the first data line.

10. The LCD according to claim 9, further comprising:
a second active element; and
a second sub-pixel electrode, disposed in the pixel area; wherein the second active element further comprises a third electrode electrically connected to the second sub-pixel electrode through a second via hole, and the first active element and the second active element both are electrically connected to the first data line.

11. The LCD according to claim 1, further comprising:
a third scan line, the second scan line is disposed between the first scan line and the third scan line; and
a storage capacitor electrode disposed between the second scan line and the third scan line;
wherein the first via hole overlaps with at least partial of the storage capacitor electrode.

* * * * *